(12) United States Patent
Igarashi et al.

(10) Patent No.: US 6,838,732 B2
(45) Date of Patent: Jan. 4, 2005

(54) SEMICONDUCTOR DEVICE AND METHOD FOR MANUFACTURING THE SAME

(75) Inventors: Motoshige Igarashi, Tokyo (JP); Hiroyuki Amishiro, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/971,958

(22) Filed: Oct. 9, 2001

(65) Prior Publication Data

US 2002/0145156 A1 Oct. 10, 2002

(30) Foreign Application Priority Data

Apr. 6, 2001 (JP) ........................................ 2001-108720

(51) Int. Cl.⁷ .............................................. H01L 29/76
(52) U.S. Cl. ..................... 257/344; 257/346; 257/389
(58) Field of Search ................................. 257/288, 344, 257/346, 389; 438/303, 304

(56) References Cited

U.S. PATENT DOCUMENTS

| | | | | |
|---|---|---|---|---|
| 5,726,479 A | * | 3/1998 | Matsumoto et al. | 257/412 |
| 5,770,508 A | * | 6/1998 | Yeh et al. | 438/305 |
| 5,817,562 A | * | 10/1998 | Chang et al. | 438/305 |
| 6,156,598 A | * | 12/2000 | Zhou et al. | 438/231 |
| 6,180,472 B1 | * | 1/2001 | Akamatsu et al. | 438/303 |
| 6,277,683 B1 | * | 8/2001 | Pradeep et al. | 438/200 |
| 6,380,038 B1 | * | 4/2002 | Yu | 438/300 |
| 2002/0000517 A1 | * | 1/2002 | Mori et al. | 257/368 |

OTHER PUBLICATIONS

Wolf, S., et al., Silicon Processing, vol. 1, 1986, Lattice Press, pp. 368–369.*

* cited by examiner

*Primary Examiner*—T. N. Quach
(74) *Attorney, Agent, or Firm*—McDermott Will & Emery LLP

(57) ABSTRACT

To provide a semiconductor device with reduced parasitic capacity in the vicinity of gate electrodes, and a method for manufacturing such a semiconductor device. The semiconductor device comprises a gate electrode formed on a silicon semiconductor substrate 1 through a gate oxide film, and a pair of impurity diffusion layers formed on the surface region of the silicon semiconductor substrate at both sides of the gate electrode. A silicon nitride film acting as a sidewall spacer is formed so as to cover the sidewall of the gate electrode, and the silicon nitride film is allowed to extend to the surface of the silicon semiconductor substrate 1 in the vicinity of the gate electrode in a substantially L-shaped profile.

11 Claims, 12 Drawing Sheets

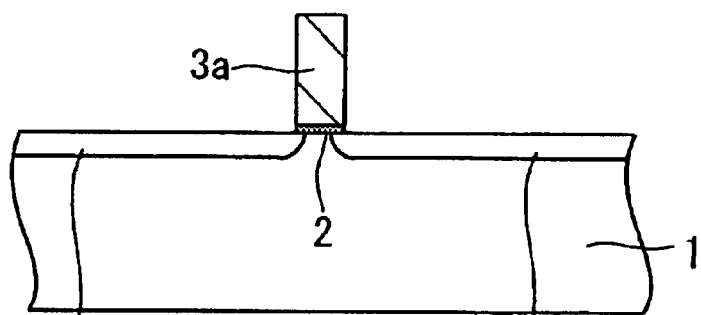
Fig. 5A
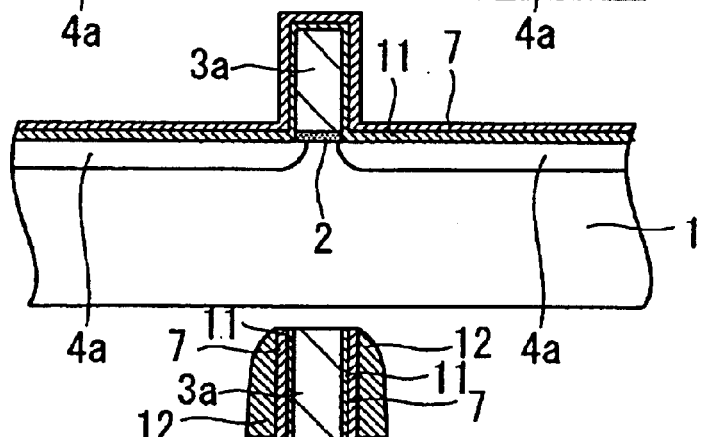
Fig. 5B
Fig. 5C
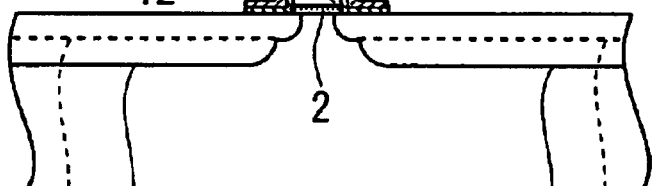
Fig. 5D
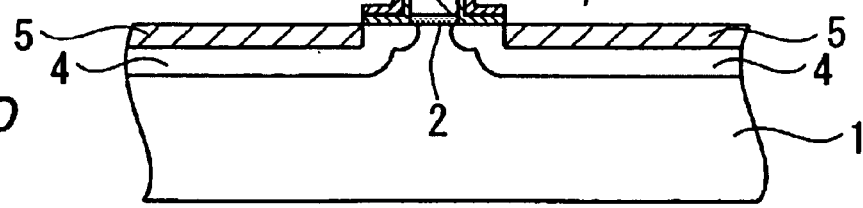
Fig. 5E
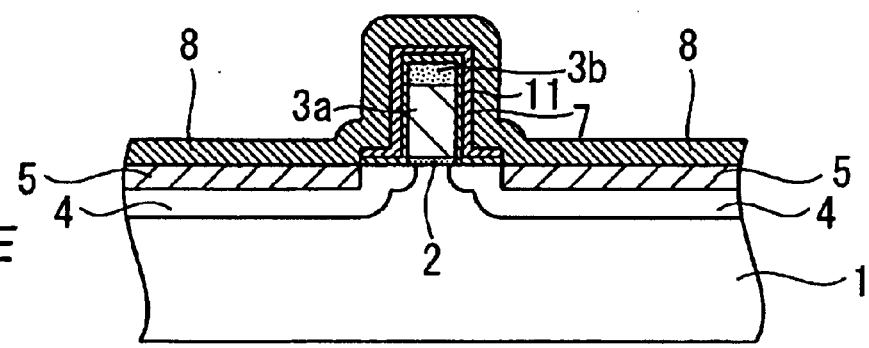

SEMICONDUCTOR DEVICE AND METHOD FOR MANUFACTURING THE SAME

BACKGROUND OF THE INVENTION

1. Field of the Invention

The present invention relates to a semiconductor device, and a method for manufacturing the semiconductor device, specifically to the gate structure of an MOS transistor and the contact structure that contains gate wirings and LIC (local interconnect).

2. Background Art

Concurrent with the size reduction of semiconductor elements, the margin of the areas for forming contacts from the upper layer to the substrate also tends to decrease. Therefore, in order to prevent the occurrence of electrical short-circuiting from the element-isolating end to the substrate when a contact is out of an active region, methods for forming contacts known as a borderless contact structure or a self align contact structure (hereafter referred to as SAC structure) are positively adopted.

In the SAC structure, materials that have an etching selection ratio with a silicon oxide film often used as an interlayer insulating film are required. An example of such materials is silicon nitride film. Therefore silicon nitride films are often used in the vicinity of the gate electrodes of MOS transistors of an SAC structure.

FIG. 16 is a schematic sectional view that shows the configuration of an MOS transistor of an SAC structure. This MOS transistor is composed of a gate electrode 103 formed on a silicon semiconductor substrate 101 through a gate oxide film 102, and a pair of impurity diffusion layers 104 formed on the surface region of the silicon semiconductor substrate 101 at the both sides of the gate electrode 103. Here, the gate electrode 103 has a salicide structure consisting of a lower-layer polysilicon film 103*a* and an upper-layer silicide film 103*b*. Another silicide film 105 is formed on the surface layers of the impurity diffusion layers 104 by salicide forming.

A sidewall spacer 107 is formed on the sidewall of the gate electrode 103. A silicon nitride film 108 is formed so as to cover the surface of each of the sidewall spacer 107, the silicide film 105, and the silicide film 103*b*. The silicon nitride film 108 functions as the etching stopper film for inhibiting the contact hole from reaching the gate electrode 103 or the element-isolating end, even if the contact hole of the contact electrode 106 connected to the impurity diffusion layers 104 is misaligned.

In such a conventional MOS transistor of the SAC structure, the places where the silicon nitride film is used include 1) the sidewall spacer 107 of the transistor gate, and 2) the etching stopper film 108 for preventing junction leakage or wiring short-circuiting when the contact hole, LIC wirings, and the like are disposed in the vicinity of the element-isolating film or the gate electrode 103.

However, since the dielectric constant of the silicon nitride film is as high as twice the dielectric constant of the silicon oxide film or higher, the silicon nitride film increases the capacity between the gate electrode 103 and the impurity diffusion layers 104 such as the source/drain, the capacity between the gate electrodes 103 of the transistors adjacent to each other, the capacity between the gate electrode 103 and the contact electrode 106, and the capacity between the gate electrode 103 and the LIC wiring. Increase in capacity is particularly significant when the LIC wirings are formed in parallel along the transistor gate in order to lower resistance with the source or the drain.

FIG. 17 is a schematic diagram showing the gate over-lapping capacity in each generation. It is seen from FIG. 17 that with each succeeding generation, the proportion of the capacity between the gate electrode and the contact (C2) increases in comparison with the capacity between the gate electrode and the diffused layer (C1). The reasons are decrease in pitch of gate electrodes or the distance between the gate electrode and the contact hole with down sizing, and increase in the proportion of the nitride film occupying the insulating film in the vicinity of the gate resulting in the elevation of effective dielectric constant. Increase in such parasitic capacity has interfered with advantages due to down sizing such as high speed and low power consumption.

Furthermore, as FIG. 18 shows, when the pitch of transistors is shortened, a problem of difficulty of forming silicide on the impurity diffusion layer 104 surrounded by the sidewall spacer 107 arises. This is because the formation of a refractory metal layer is difficult by methods such as sputtering, since the sidewall spacer 107 fills the space between gate electrodes 103. Also, a problem in which the stress of the nitride film inhibits the growth of silicide between gate electrodes arises. As a result, silicide resistance rises, inhibiting the high-speed operation of the device.

On the other hand, since a contact hole that connects a gate electrode and an impurity diffusion layer simultaneously (hereafter referred to as a shared contact) can reduce the memory cell size, it is used in memories that require high integration, such as SRAM cells. FIG. 19 is a schematic sectional view showing an example of an MOS transistor that has a shared contact electrode 114. Since a shared contact is characterized in a structure to connect a gate electrode at the upper portion of the electrode, it can connect a gate electrode and an impurity diffusion layer simultaneously without adding a special mask or an ion implantation step.

However, when a sidewall spacer 107 or an etching stopper film 108 as shown in FIGS. 16 and 18 is used, the portions of the sidewall spacer 107 and the etching stopper film 108 cannot contribute to connection to at least an impurity diffusion layer 105 as FIG. 19 shows. Therefore, the shared contact cannot be scaled to meet the requirements of down sizing, as FIG. 19 shows, the size reduction and high integration of memory cells cannot be achieved.

Furthermore, with decrease in the width Lg of the gate electrode 103 of a transistor, problems of increased wiring resistance and unstable resistance when silicide is formed arise.

SUMMARY OF THE INVENTION

In order to solve the above-described problems, the first object of the present invention is to achieve the further reduction of parasitic capacity in the vicinity of the gate electrode.

The second object of the present invention is to provide a semiconductor device that has a low-resistance silicide layer between gates even if the pitch of the gate is reduced.

The third object of the present invention is to inhibit the occurrence of defective junction leakage and increased contact resistance by optimizing shapes of respective films constituting a gate.

The fourth object of the present invention is to further reduce the diameter of shared contacts.

The fifth object of the present invention is to provide a semiconductor device that has a low-resistance gate electrode even if the size of memory cells is reduced, and the gate width is narrowed.

According to one aspect of the present invention, a semiconductor device comprises a gate electrode formed on a semiconductor substrate through a gate insulating film, a pair of impurity diffusion layers formed on the surface region of the semiconductor substrate at both sides of the gate electrode, and a first insulating film formed so as to cover the sidewalls of the gate electrode. The first insulating film extends to the surface area of the semiconductor substrate in the vicinity of the gate electrode.

According to another aspect of the present invention, a method for manufacturing a semiconductor device comprises the following steps. Firstly a gate electrode is formed on a semiconductor substrate through a gate insulating film. Secondly a first insulating film is formed so as to cover the top surface and the sides of the gate electrode, and the surface the semiconductor substrate. Thirdly an etching mask film for etching the first insulating film is formed on the first insulating film. Fourthly the etching mask film is removed except from the side of the gate electrode by anisotropic etching, and the first insulating film is removed by continuing the etching using the etching mask film remaining on the sidewalls of the gate electrode as the mask, therefore the first insulating film which has a configuration to extend from the sidewalls of the gate electrode to the surface area of the semiconductor substrate underneath the remaining etching mask film is made. Fifthly the etching mask film is removed. Sixthly a second insulating film is formed on the surface of the semiconductor substrate, so as to cover the gate electrode and the semiconductor substrate.

According to the present invention, since the sidewall spacer is produced by forming a first insulating film having an L-shaped cross section so as to extend from the sidewalls of gate electrodes to the surface of the semiconductor substrate, the thickness and volume of the sidewall spacer in the lateral direction of the gate electrodes can be minimized, and parasitic capacities between gate electrodes and between the gate electrode and the contact electrode can be reduced.

Other and further objects, features and advantages of the invention will appear more fully from the following description.

BRIEF DESCRIPTION OF THE DRAWINGS

FIGS. 5A to 5E are schematic sectional views showing the sequence of steps for manufacturing the semiconductor device according to First Embodiment;

DETAILED DESCRIPTION OF THE PREFERRED EMBODIMENTS

First Embodiment

Figure 1:
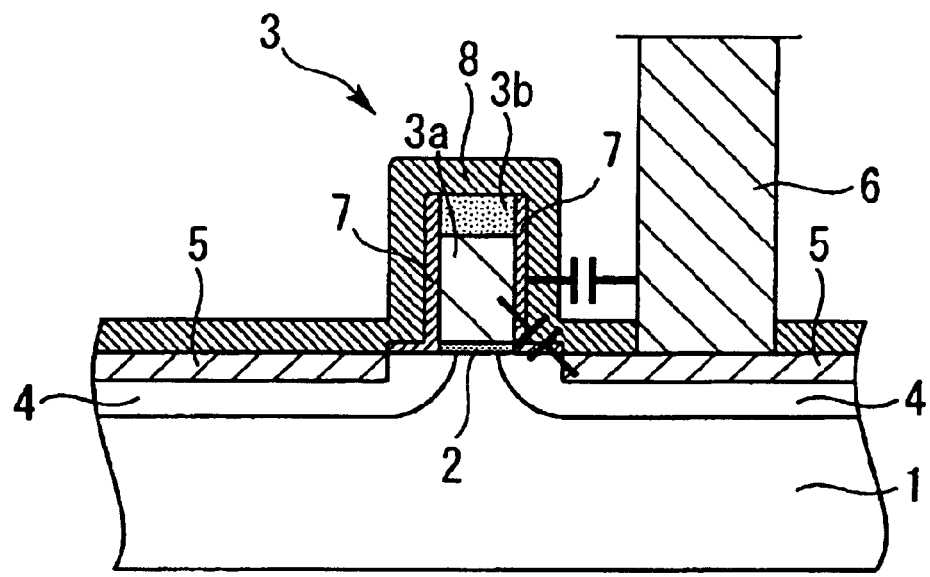
FIG. 1 is a schematic sectional view showing a semiconductor device according to First Embodiment of the present invention.

FIG. 1 is a schematic sectional view showing a semiconductor device according to First Embodiment of the present invention. The configuration of the semiconductor device of First Embodiment will be described below referring to FIG. 1. The semiconductor device of First Embodiment is an example of MOS transistors of an SAC structure to which the present invention is applied, and comprises a gate electrode 3 formed on a silicon semiconductor substrate 1 through a gate oxide film 2; a pair of impurity diffusion layers 4 of source/drain diffused layers formed on the surface region of the silicon semiconductor substrate 1 in the both sides of the gate electrode 3; a silicide film 5 formed on the surface of the impurity diffusion layers 4; and a contact electrode 6 electrically connected to the silicide film 5.

Silicon nitride films 7 are formed on the sidewalls of the gate electrode 3. These silicon nitride films 7 are formed so as to extend from the sidewalls of the gate electrode 3 to the surface of the silicon semiconductor substrate 1, and have substantially L-shaped cross section along the direction perpendicular to the direction of the gate electrode 3 as FIG. 1 shows.

The gate electrode 3 has a salicide structure consisting of two layers, a polysilicon film 3a and a silicide film 3b such as titanium silicide ($TiSi_2$). The silicide film 5 on the impurity diffusion layer 4 and the silicide film 3b constitutes the upper portion of the gate electrode 3 is formed in the same step by salicidation.

A silicon nitride film 8 is formed so as to cover the gate electrode 3 and the surface of the silicon semiconductor substrate 1. The silicon nitride film 8 is a film that functions as an etching stopper film when forming the contact hole of the contact electrode 6 that reaches the impurity diffusion layer 4, and inhibits the contact hole to reach the gate electrode 3 or the element-isolating end even if the mask is misaligned to some extent when the contact hole is formed.

In the area where silicon nitride films 7 are formed, the silicon nitride film 8 covers the sidewall of the gate electrode 3 or the surface of the silicon semiconductor substrate 1 through the silicon nitride films 7. Also, the silicon nitride film 8 is formed so as to cover the surface of the silicide film 3b on the gate electrode 3, and the surface of the silicide film 5 on the impurity diffusion layer 4.

In the semiconductor device of First Embodiment, the silicon nitride film 7 formed on the sidewall of the gate electrode 3 functions as a sidewall spacer, and when the LDD structure of an MOS transistor is formed as described later, the silicon nitride film 7 becomes a mask for forming a high-concentration impurity diffusion layer 4b. As FIG. 1 shows, since the silicon nitride film 7 as a sidewall spacer is formed in a substantially uniform thickness so as to cover on the sidewall of the gate electrode 3 and the specific range the surface of the silicon semiconductor substrate 1, the thickness and volume of the silicon nitride film 7, particularly present on the sides of the gate electrode 3, can be significantly reduced. At the same time, the expansion of the silicon nitride film 8 formed on the silicon nitride film 7 in the lateral direction can be inhibited, minimizing also the thickness and volume of the silicon nitride film 8 on the sides of the gate electrode 3. Thus, the parasitic capacity produced between the gate electrode 3 and the contact electrode 6, or between gate electrodes 3 adjacent to each other can be minimized by decreasing the volume occupied by the silicon nitride film of a high dielectric capacity in the sidewalls of the gate electrode 3.

Figure 2:
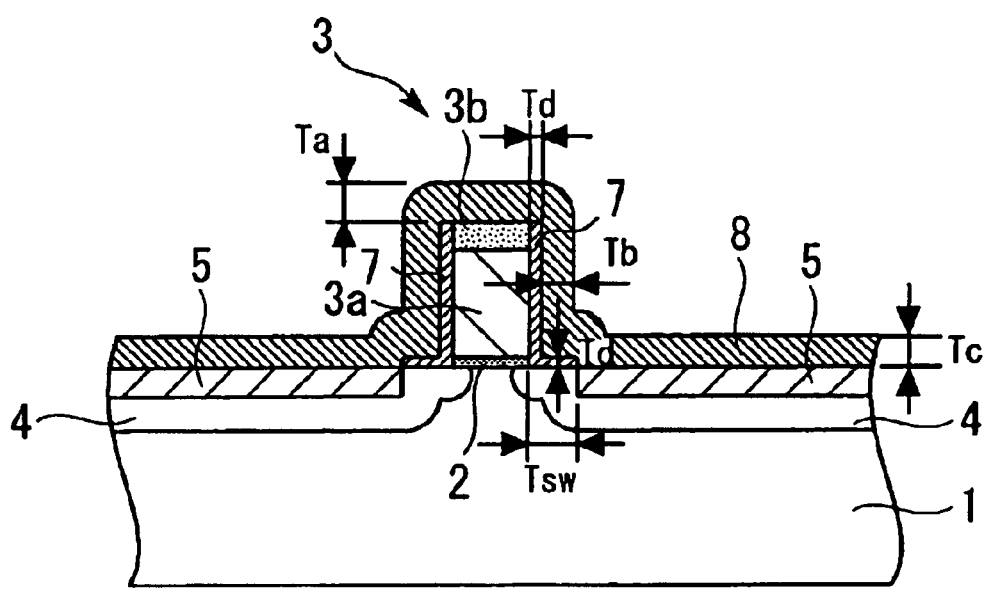
FIG. 2 is a schematic sectional view showing the details of dimensions of each film constituting the periphery of a gate electrode in the semiconductor device of FIG. 1.

FIG. 2 is a schematic sectional view showing the details of dimensions of each film constituting the periphery of a gate electrode 3 in the semiconductor device of FIG. 1. In First Embodiment, as FIG. 2 shows, the configuration of the sidewall spacer of the gate electrode 3 of the MOS transistor is determined so as to satisfy the following formula by constituting the sidewall spacer with the silicon nitride film 7, which has a dielectric constant higher at least than the dielectric constant of a silicon oxide film ($\epsilon$=3.9) as an insulating material:

$$Tsw \geq 2 \times Td$$

where Td is the thickness of the silicon nitride film 7 on the sides of the gate electrode 3 and the surface of the silicon semiconductor substrate 1, and Tsw is the length (width) of the silicon nitride film 7 that extends horizontally on the silicon semiconductor substrate 1 from the sides of the gate electrode 3 toward the impurity diffusion layer 4.

Thus, the volume of the silicon nitride film 7 on the sides of the gate electrode 3 can be minimized by reducing the thickness of the silicon nitride film 7 on the sides of the gate electrode 3 to ½ or less the length in the horizontal direction (=Td) of the silicon nitride film 7 on the surface of the silicon semiconductor substrate 1. Since the thickness of the sidewall spacer on the sides of the gate electrode 3 can be reduced, the parasitic capacity mainly between the gate electrodes 3 adjacent to each other, and between the gate electrode 3 and the contact electrode 6 can be minimized.

In the structure of FIG. 2, the silicon nitride film 7 as a sidewall spacer can be substituted by a dual-layer film or multi-layer film consisting of silicon nitride and silicon oxide films. In the case of the structure that contains a silicon nitride film in the sidewall spacer, stress with the gate electrode 3 can be relieved by reducing the constituting ratio of the silicon nitride film.

Also in the semiconductor device of First Embodiment, as FIG. 2 show, the configuration of the silicon nitride film 8 as a etching stopper film is preferably a device configuration that satisfies:

$$Tb<Ta,\ Tb<Tc,$$

where Ta represents the thickness of the silicon nitride film 8 on the surface of the gate electrode 3, Tb represents the thickness of the silicon nitride film 8 on the sides of the gate electrode 3, and Tc represents the thickness of the silicon nitride film 8 on the silicon semiconductor substrate 1.

As described above, the volume of the silicon nitride film 8 on the sides of the gate electrode 3 can be minimized by reducing the thickness Tb of the silicon nitride film 8 on the sides of the gate electrode 3 than the thickness Ta on the surface of the gate electrode 3 and the thickness Tc on the silicon semiconductor substrate 1, and the parasitic capacity mainly between the gate electrodes 3 adjacent to each other, and between the gate electrode 3 and the contact electrode 6 can be minimized.

Also, since the silicon nitride film 7 is formed along the sidewall of the gate electrode 3 in a uniform thickness, the silicon nitride film 8 can be formed on the sidewall of the gate electrode 3 in a uniform thickness, and the surface of the silicon nitride film 8 can be made perpendicular to the surface of the silicon semiconductor substrate 1. Therefore, even if the contact hole or the LIC wiring is misaligned with the gate electrode 3, the contact hole or the LIC wiring is prevented from contacting with the silicon nitride film 8. Therefore, decrease in the contact area of the contact electrode 6 to the impurity diffusion layer 4 (the silicide film 5) can be prevented, stabilizing the contact resistance.

In order to form the silicon nitride film 8 so as to satisfy the film thickness conditions of Tb<Ta and Tb<Tc, the silicon nitride film 8 is formed using the plasma CVD method. Thereby, the silicon nitride film 8 that satisfies the film thickness conditions of Tb<Ta and Tb<Tc can be formed.

Furthermore, in the semiconductor device of First Embodiment, the device configuration that satisfies Ta>Tc, as shown in FIG. 2, is preferable.

In the SAC structure, the film thickness required for making the silicon nitride film 8 that acts as an etching stopper is determined from the thickness Ta of the silicon nitride film 8 on the surface of the gate electrode 3 subjected to the heaviest over-etching. In addition, by making the thickness Tc smaller than the thickness Ta, the over-etching can be reduced when the contact hole is formed in the impurity diffusion layer 4 for embedding the contact electrode 6, and therefore, the junction leakage mainly caused by over-etching can be suppressed. Therefore, parasitic capacity can be reduced by decreasing the thickness of the silicon nitride film 8 that acts as an etching stopper film to a minimum required thickness while satisfying the condition of Ta>Tc.

Furthermore, in the semiconductor device of First Embodiment, it is preferable that the device configuration satisfies $$Tsw = Tb + Td$$

with regard to a structure of the sidewall spacer and the etching stopper film of the transistor gate.

As described above, Tsw represents the length (width) of the silicon nitride film 7 in the horizontal direction on the silicon semiconductor substrate 1. Tb represents the thickness of the silicon nitride film 8 on the sidewall of the gate electrode 3, and Td represents the thickness of the silicon nitride film 7.

From such configuration, the optimal structure for devices that adopt shared contact or borderless structure in consideration of size reduction and device performance.

Figure 3:
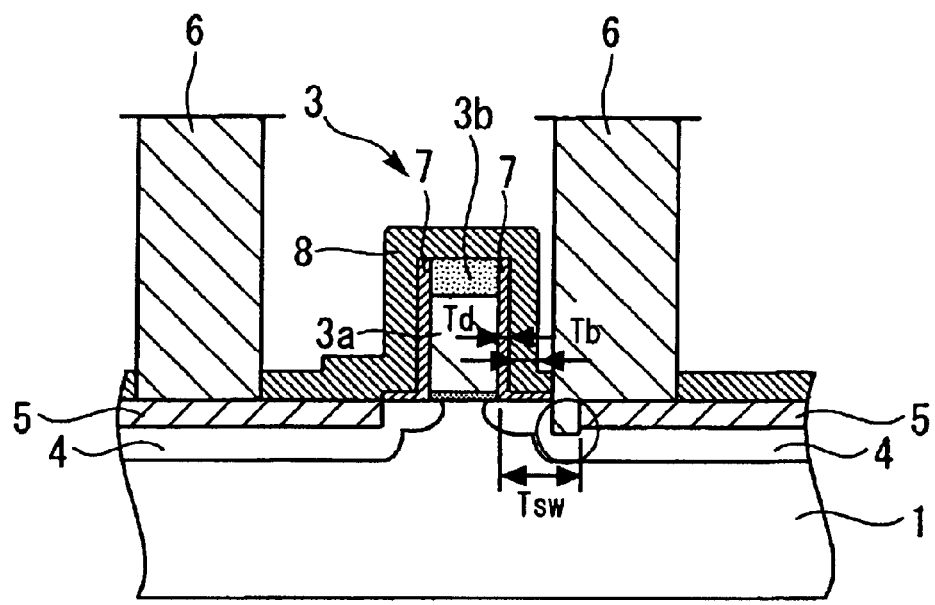
FIG. 3 is a schematic sectional view showing a comparative example for illustrating the effect of the semiconductor device according to First Embodiment.

The advantage of satisfying Tsw=Tb+Td will be described referring to comparative examples of FIGS. 3 and 4. FIG. 3 shows the case where Tsw>Tb+Td. In this configuration, when the contact hole to be filled with the contact electrode 6 is misaligned toward the gate electrode 3, the contact hole reaches the silicon semiconductor substrate 1 in the state of overlapping with the location of the silicon nitride film 7 on the silicon semiconductor substrate 1. Therefore, the contact electrode 6 reaches the low-concentration impurity diffusion layer 4 underneath the silicon nitride film 7, resulting in the defect of junction leakage underneath the silicon nitride film 7. Since the junction is shallow underneath the silicon nitride film 7, junction leakage occurs easily if the contact hole is disposed here. Furthermore, if a silicide film 5 is formed on the impurity diffusion layer 4 as shown in FIG. 3, since the location of the contact hole becomes out of the silicide film 5, the contact electrode 6 is directly connected to the impurity diffusion layer 4, and the problem of very high contact resistance arises.

Figure 4:
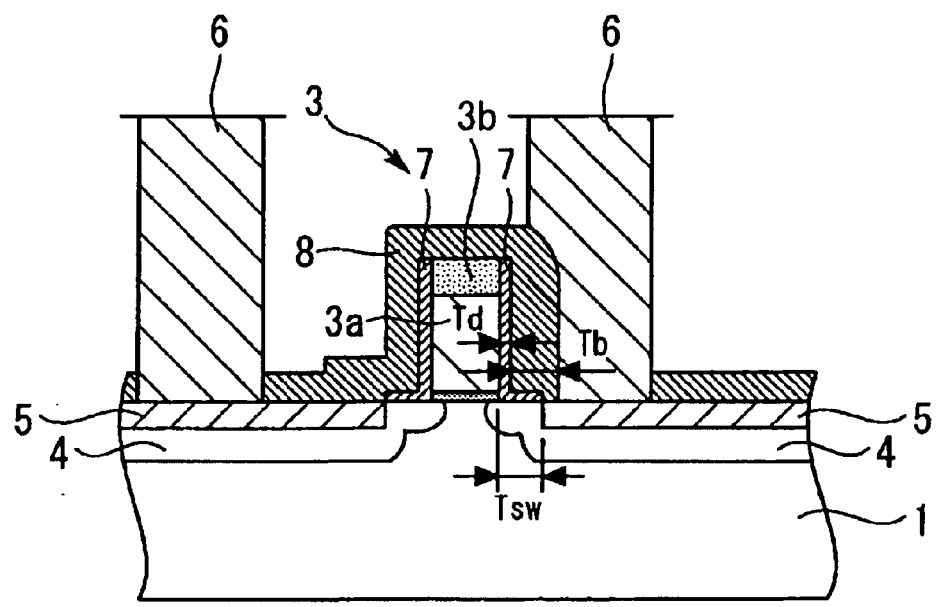
FIG. 4 is a schematic sectional view showing another comparative example for illustrating the effect of the semiconductor device according to First Embodiment.

Also as FIG. 4 shows, if Tsw<Tb+Td, since the contact electrode 6 interferes with the silicon nitride film 8 unless the location of the contact electrode 6 is sufficiently separated from the gate electrode 3, the contacting area of the contact electrode 6 to the impurity diffusion layer 4 (the silicide film) decreases. Thereby, the resistance of the contact electrode 6 and the silicide film 5 is elevated.

On the contrary, in the configuration of First Embodiment shown in FIG. 2 in which Tsw=Tb+Td, even if the contact hole is misaligned toward the gate electrode 3, since the silicon nitride film 7 is always located underneath the silicon nitride film 8 that covers the sidewall of the gate electrode 3, the contact hole is prevented from passing through the silicon nitride film 7 and reaching the underlying silicon semiconductor substrate 1. Also, since the distance between the contact electrode 6 and the silicon nitride film 8 can be maximized, the interference between the contact electrode 6 and the silicon nitride film 8 can be prevented, and decrease in contact resistance between the contact electrode 6 and the silicide film 5 can be minimized.

Next, the method for manufacturing the semiconductor device of First Embodiment will be described. In the following description of the manufacturing method, the major process for forming the silicon nitride film 7 will be described referring to FIGS. 5A to 5E, and other processes will be described without referring to drawings. First, an insulating film for isolating elements is formed on a silicon semiconductor substrate 1. Element isolation is performed using methods such as the LOCOS method or the trench method. Thereafter, ion implantation is performed to the active element region for forming the well and controlling the threshold value.

Next, a gate oxide film 2 is formed, then a polysilicon film 3a is deposited as the gate electrode material, and the gate electrode is patterned. The gate electrode is patterned using a photoresist, or an insulating film such as a silicon oxide film and a silicon nitride film as the mask.

Next, low-concentration impurity ions are implanted using the gate electrode (the polysilicon film 3a) as the mask, for forming shallow junction approaching the gate electrode. Thereby, a low-concentration impurity diffusion layer 4a is formed on the both sides of the silicon semiconductor substrate 1 on the both sides of the gate electrode. This state is shown in FIG. 5A.

Thereafter, in process steps shown in FIGS. 5B to 5D, a silicon nitride film 7 that acts as a sidewall spacer is formed on the both sides of the gate electrode 3. The sidewall spacer is formed by forming a three-layer structure consisting of a silicon oxide film 11, a silicon nitride film 7, and a silicon oxide film 12, performing anisotropic etching to leave these films only on the sidewall of the gate electrode 3, forming an MOS transistor by introducing an impurity in the silicon semiconductor substrate 1, and then removing the outermost silicon oxide film 12.

First, as FIG. 5B shows, a silicon oxide film 11 is formed so as to cover the upper surface and the sides of the gate electrode 3, and the surface of the silicon semiconductor substrate 1, and then a silicon nitride film 7 is formed on the silicon oxide film 11.

Next, a silicon oxide film 12, such as BPTEOS and NSG, is formed on the silicon nitride film 7. Thereafter, as FIG. 5C shows, the silicon oxide film 12 on the silicon semiconductor substrate 1 is removed by anisotropic etching, leaving the silicon oxide film 12 only on the sidewall of the gate electrode consisting of a polysilicon film 3a. Then, etching is continued using the silicon oxide film 12 as the mask to remove the silicon nitride film 7 on the silicon semiconductor substrate 1 other than the area underlying the silicon oxide film 12, and on the gate electrode. Thereby, as FIG. 5C shows, the structure covered with the silicon nitride film 7 that has an L-shaped profile from the sidewall of the gate electrode 3 to the surface of the silicon semiconductor substrate 1 can be formed.

At this time, by performing etching so as to leave the silicon oxide film 11 underlying the silicon nitride film 7, the surface of the silicon semiconductor substrate 1, particularly in the impurity diffusion layer 4, can be prevented from being damaged. The silicon oxide film 11 is a film that functions to prevent the surface of the silicon semiconductor substrate 1 from being damaged, to be buffer layer between the silicon nitride film 7 that has high interface state and the gate electrode 3, and to relieve the stress in the buffer layer between the silicon nitride film 7 and the gate electrode 3. In the description of each embodiment other than FIGS. 5A to 5E, the description and the illustration of the silicon oxide film 11 will be omitted.

After the sidewall spacer of the silicon nitride film 7 has been formed, for the purpose of forming deep junction, ion implantation of an impurity of a high concentration is performed using the gate electrode 3, the silicon nitride films 7 and the silicon oxide films 12 on the both sides of the gate electrode 3 as the mask. Thereafter, heat treatment is performed for activating the impurity to form silicide.

When the upper layer of the gate electrode is converted to silicide, the gate electrode is formed mainly of polysilicon, and the structure having no insulating film on the upper layer of the gate electrode is required at least immediately before this process. Therefore, the silicon oxide film 11 on the gate electrode 3 and the impurity diffusion layer 4 has been removed before the silicide process.

Then, a refractory metal film such as a titanium (Ti) film is formed using, for example, sputtering so as to cover the upper surface of the gate electrode 3, the silicon oxide film 12, and the impurity diffusion layer 4. This so-called salicide process forms a silicide film 3b consisting of titanium silicide ($TiSi_2$) on the upper surface of the gate electrode 3, as well as a silicide film 5 on the surface of the impurity diffusion layer 4. Thereafter, the silicon oxide film 12 on the sidewall of the gate electrode 3 is removed. The use of the material that is easily dissolved in hydrofluoric acid, such as BPTEOS or NSG, facilitates the removal of the silicon oxide film 12 using wet etching.

The silicidation of the gate electrode 3 and the impurity diffusion layer 4 can also be performed by forming a titanium film after removing the silicon oxide film 12, followed by heat treatment. Also, the silicon oxide film 12 may be removed prior to the process of ion implantation of a high-concentration impurity, and the ion implantation of a high-concentration impurity may be performed using the gate electrode 3 and the silicon nitride film 7 as the mask.

In this silicide process, since the silicon nitride film 7 is used as the sidewall spacer, the variation of distance from the gate electrode (frame width) can be minimized in the formation of the silicide film 5.

Since the formation of silicide films 3b and 5 reduces the parasitic resistance of the gate electrode 3 and the impurity diffusion layer 4, it is particularly suited to the high-speed operation of a device, and to the application to logic LSIs or system LSIs.

Next, as FIG. 5E shows, a silicon nitride film 8 acting as an etching stopper film is formed so as to cover the surface of the silicon semiconductor substrate 1 and the upper surface of the gate electrode 3.

Thereafter, an interlayer insulating film is deposited on the entire surface of the silicon semiconductor substrate 1 to constitute a film between contact layers. The insulating film chiefly used in this time is a silicon oxide film. In recent years, the space between a contact hole and an element isolating film or a gate electrode tends to be small due to requirement for size reduction, and the structure for preventing junction leakage or wiring short-circuiting has been demanded. In the semiconductor device of First Embodiment, an etching stopper film is introduced between contact layers by using an SAC structure to prevent junction leakage or wiring short-circuiting.

Etching for forming the contact hole of the contact electrode 6 is once stopped at the silicon nitride film 8 by the use of the SAC structure, and then, the silicon nitride film 8 is additionally etched as required to reduce unnecessary over etching. As a result, even if the hole overlaps the element-isolating region due to misalignment, the element-isolating region is not subjected to excessive etching, whereby junction leakage can be prevented. It is preferable to use a material that has a sufficient etching selection ratio to generally used silicon oxide films for the etching stopper film as a contact interlayer insulating film, and excessive etching can be prevented by the use of the silicon nitride film 8.

After forming the contact hole that reaches the silicide film 5 of the impurity diffusion layer 4, the contact electrode 6 to fill the contact hole is formed to complete the semiconductor device of First Embodiment.

In the semiconductor device of First Embodiment, as described above, since a sidewall spacer consisting of silicon nitride film 7 that has a substantially L-shaped profile is formed so as to extend from the sidewall of the gate electrode 3 to the upper surface of the silicon semiconductor substrate 1, the formation of a spread-shaped sidewall spacer from the upper layer toward the lower layer of the silicon semiconductor substrate 1 can be prevented. Therefore, the thickness and the volume of the sidewall spacer on the side of the gate electrode 3 can be reduced significantly, minimizing the parasitic capacities between gate electrodes 3 or between the gate electrode 3 and the contact electrode 6.

Since the dimensions of the silicon nitride film 7 as the sidewall spacer, and the silicon nitride film 8 as the etching stopper film are optimized, interference between the gate electrode 3 and the contact electrode 6 is inhibited to minimize the electrical resistance between the contact electrode 6 and the silicide film 5, and the reach of the contact electrode 6 to the low-concentration impurity diffusion layer 4a underlying the silicon nitride film 7 can be prevented.

Second Embodiment

Figure 6:
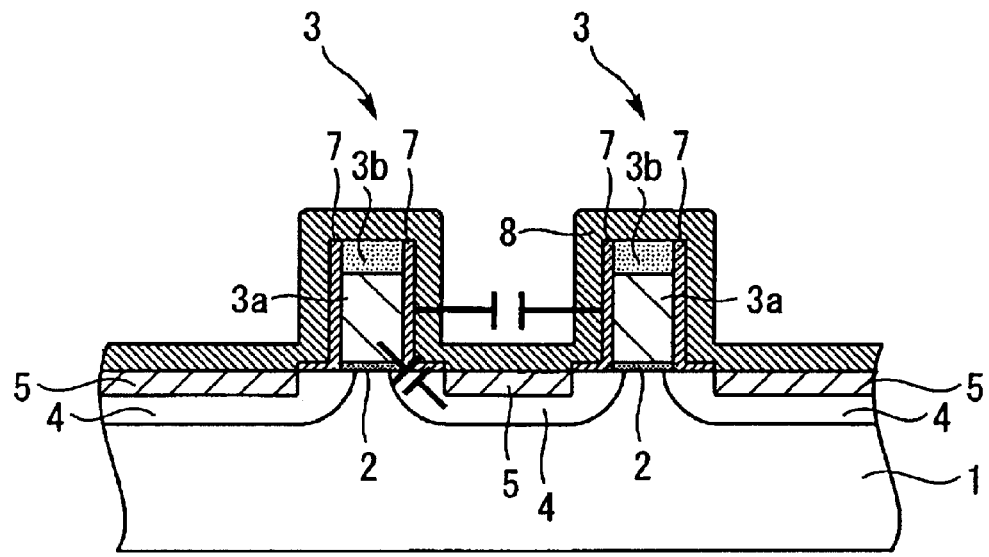
FIG. 6 is a schematic sectional view showing a semiconductor device according to Second Embodiment of the present invention.

FIG. 6 is a schematic sectional view showing a semiconductor device according to Second Embodiment of the present invention. Second Embodiment shows a memory cell configuration in which a silicide film 5 is formed in an impurity diffusion layer 4 on the surface of a silicon semiconductor substrate 1 between gate electrodes 3 formed adjacent to each other. The configurations of the gate electrode 3, the silicon nitride film 7 around the gate electrode 3, and the silicon nitride film 8 are the same as those in First Embodiment.

It is very difficult to form silicide in an impurity diffusion layer surrounded by a gate electrode. The reason for this is that the sidewall spacer formed on the sidewall of the gate electrode extends laterally. In particular, if the pitch between gate electrodes is small, the formation of a refractory-metal film on the impurity diffusion layer by sputtering becomes difficult.

In the semiconductor device shown in FIG. 6, a silicon nitride film 7 of a uniform thickness is formed so as to extend from the sidewall of a gate electrode 3 to the surface of a silicon semiconductor substrate 1 in the same manner as in the First Embodiment, and this is used as a sidewall spacer. Therefore, in the stage before a silicon nitride film 8 is formed, the exposed area of an impurity diffusion layer 4 between gate electrodes 3 can be maximized. Therefore, even if sputtering is used, a refractory-metal film can be formed certainly on the impurity diffusion layer 4 between gate electrodes 3. Thereby, since the region occupied by the sidewall spacer between gate electrodes 3 adjacent to each other can be minimized even if the pitch between gate electrodes 3 is reduced due to down sizing, the refractory-metal film required for the silicide reaction can be formed sufficiently. The device configuration of Second Embodiment is particularly effective in memory cells that require narrowed pitches, and the like.

Also, by performing the LDD forming process using this L-shaped silicon nitride film 7, the source/drain of the LDD structure having shallow junctions and deep junctions between gate electrodes 3 adjacent to each other can be formed simultaneously as in the description of First Embodiment.

Next, another example of the semiconductor device of Second Embodiment will be described below referring to FIG. 7. As in the semiconductor device of FIG. 6, a silicide film 5 is formed in the impurity diffusion layer 4 between gate electrodes 3, and a hollow region 10 is formed in the interlayer insulating film 9 formed between gate electrodes 3 where at least the contact hole is not formed, to reduce the parasitic capacity between gate electrodes 3. The hollow region 10 is in a vacuum state or filled with an inert gas. The configurations of the gate electrode 3, the silicon nitride film 7 around the gate electrode 3, and the silicon nitride film 8 are the same as those in First Embodiment.

The formation of the hollow region 10 is simultaneously performed with the formation of the interlayer insulating film 9. Therefore, no mask-forming process for forming the hollow region 10 is required, and the hollow region 10 can be formed without complicated processes. When the contact that reaches from the upper layers of the gate electrodes 3 to the gate electrodes 3 is formed, the hollow region 10 is produced considering the dimensional variation of the gate electrodes 3 in the lateral direction, the dimensional variation of the diameter of the contact, and the misalignment of the contact from the gate electrodes 3, and the hollow region 10 is formed so that the contact to the gate electrodes 3 does not contact to the hollow region 10.

Figure 7:
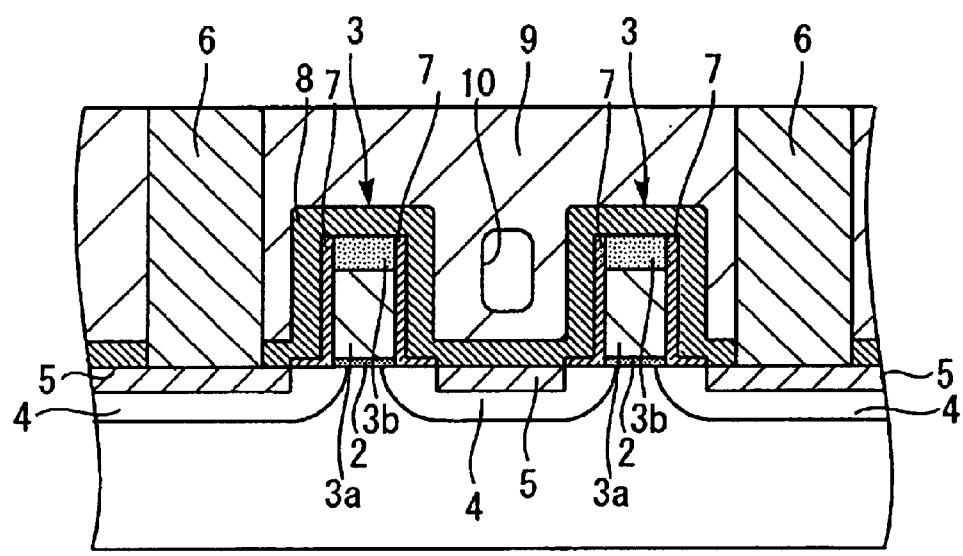
FIG. 7 is a schematic sectional view showing another semiconductor device according to Second Embodiment of the present invention.

In the semiconductor devices shown in FIGS. 6 and 7, since the structures of the silicon nitride film 7 and the silicon nitride film 8 around gate electrodes 3 are optimized as in the semiconductor device of First Embodiment, particularly the thickness and the volume of the silicon nitride films on the sidewalls of gate electrodes 3 can be minimized, and the parasitic capacity between gate electrodes 3 can be reduced. In addition, in the semiconductor device shown in FIG. 6, the silicide film 5 can be formed accurately in the narrow pitch between the gate electrodes 3. Furthermore, in the semiconductor device shown in FIG. 7, since the hollow region 10 is additionally formed in the interlayer insulating film 9, further reduction of parasitic capacities between the gate electrodes 3 and between the gate electrode 3 and the contact electrode 6 can be realized.

Next, a further example of the semiconductor devices of Second Embodiment will be described below referring to FIGS. 8A to 8D. FIGS. 8A to 8D are sectional views showing the configuration of the semiconductor device together with a method of the manufacture thereof.

Figure 8A:
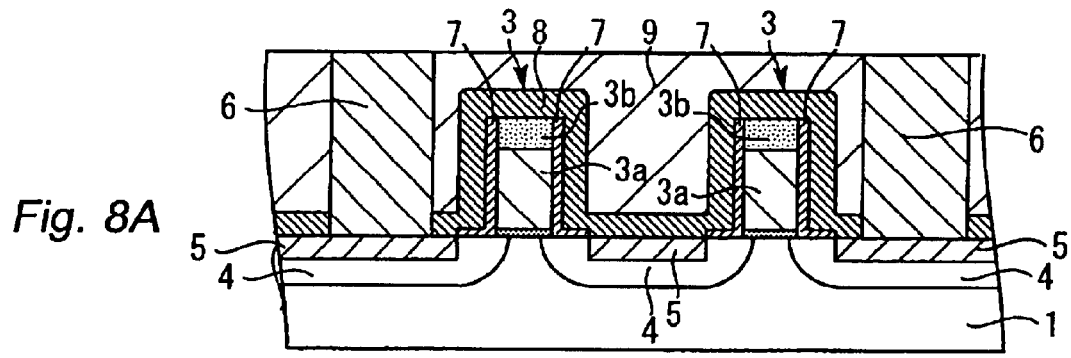
FIGS. 8A to 8D are schematic sectional views showing still another semiconductor device according to Second Embodiment of the present invention.
Figure 8B:
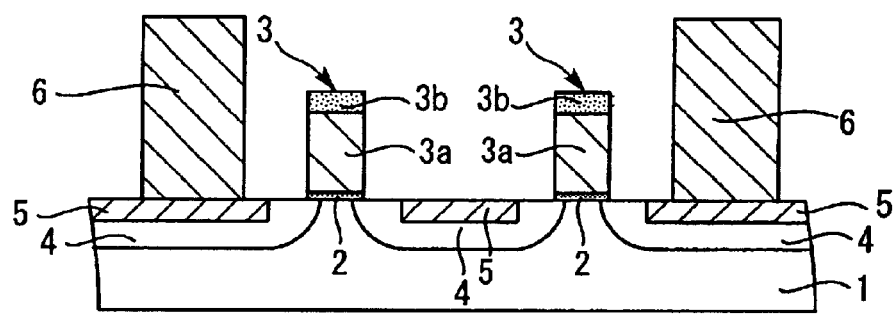
Figure 8C:
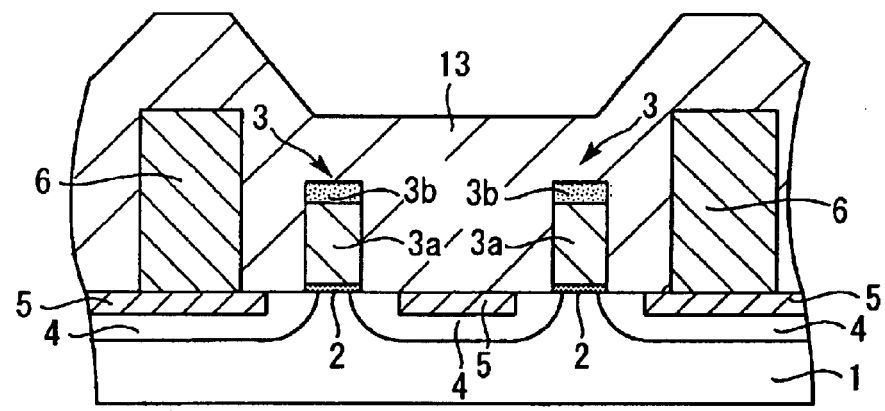
Figure 8D:
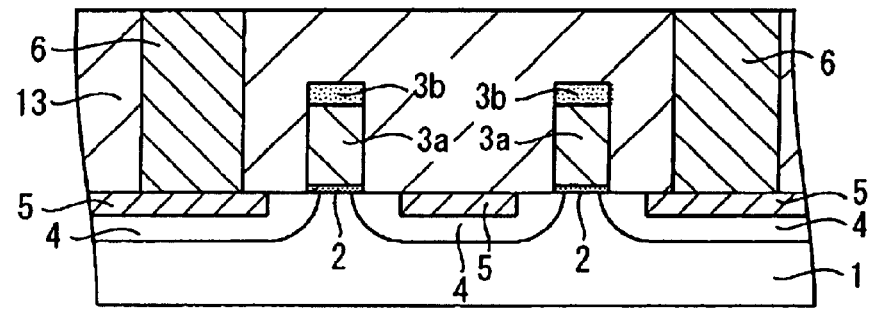

In the semiconductor device shown in FIGS. 8A to 8D, silicon nitride films 7 and silicon nitride films 8 are formed around gate electrodes 3 as in First Embodiment, an interlayer insulating film 9 is formed on the entire surface of a silicon semiconductor substrate 1 including the gate electrodes 3, shared contacts or borderless contacts are formed using the silicon nitride films 8 acting as silicon nitride film etching stopper films, then the interlayer insulating film 9 and the insulating films including the silicon nitride films 8 are once removed, and a low-dielectric constant (low k) film 13 having a lower dielectric constant than the dielectric constant of silicon oxide film ($\epsilon$=3.9) is formed again between the gate electrodes 3 and between the contact electrodes 6. By forming the low-k film 13 is formed after the silicon nitride films 7 and the silicon nitride films 8 have been removed as FIG. 8D shows, the dielectric constant between the gate electrodes 3 can further be reduced, and the generation of parasitic capacity can be minimized.

The method for manufacturing the semiconductor device shown in FIGS. 8A to 8D will be described below in detail. FIG. 8A shows the state in which a semiconductor device according to First Embodiment shown in FIG. 1 has been formed, the silicon semiconductor substrate 1 has been covered with an interlayer insulating film 9, and gate electrodes 3 have been formed so as to be adjacent to each other. The process up to this state is the same as the method for manufacturing the semiconductor device described for First Embodiment. From this state, the interlayer insulating film 9 is removed, and the silicon nitride films 7 and the silicon nitride films 8 are removed to obtain the structure shown in FIG. 8B.

Next a low-k film 13 having a lower dielectric constant than the dielectric constant of silicon oxide film ($\epsilon$=3.9) is formed on the entire surface of the silicon semiconductor substrate 1 so as to cover the gate electrodes 3 and the contact electrodes 6 as FIG. 8C shows.

Thereafter, the surface of the low-k film 13 is planarized by polishing with a method such as CMP (chemical-mechanical polishing) to expose the upper surfaces of the contact electrodes 6. Thereby, the structure shown in FIG. 8D is obtained.

According to the semiconductor device shown in FIG. 8, since the silicon nitride films 7 and 8 on the sides of the gate electrodes 3 are removed, and the low-k film 13 is formed between the gate electrodes 3, further reduction of parasitic capacities between the gate electrodes 3 and between the contact electrodes 6 can be achieved.

Third Embodiment

Next, Third Embodiment of the present invention will be described. As described referring to FIG. 19, since a shared contact for simultaneously connecting the gate and the impurity diffusion layer is suitable for the size reduction of memory cells, it is used in SRAM cells and the like that require high integration.

Figure 9:
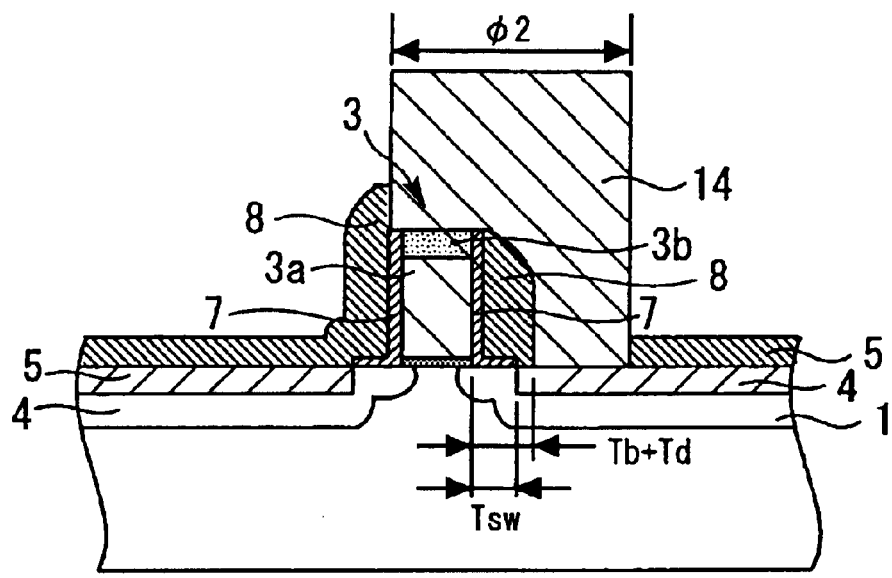
FIG. 9 is a schematic sectional view showing a semiconductor device according to Third Embodiment of the present invention.

The semiconductor device of Third Embodiment is the semiconductor device of First Embodiment applied to a memory cell that has a shared contact. The configuration of the semiconductor device of Third Embodiment will be described below referring to FIG. 9. In FIG. 9, the configuration of gate electrodes 3, and the silicon nitride films 7 and 8 around the gate electrodes 3 is the same as the configuration of First Embodiment.

In the semiconductor device shown in FIG. 9, the silicon nitride films 8 on one surface of the impurity diffusion layer 4 are removed due to the formation of the contact hole, and the silicon nitride films 8 are also removed from the upper surface of the gate electrode 3. A shared contact electrode 14 connected to both the silicide film 3b of the gate electrode 3 and the silicide film 5 of the impurity diffusion layer 4 is formed.

Figure 19:
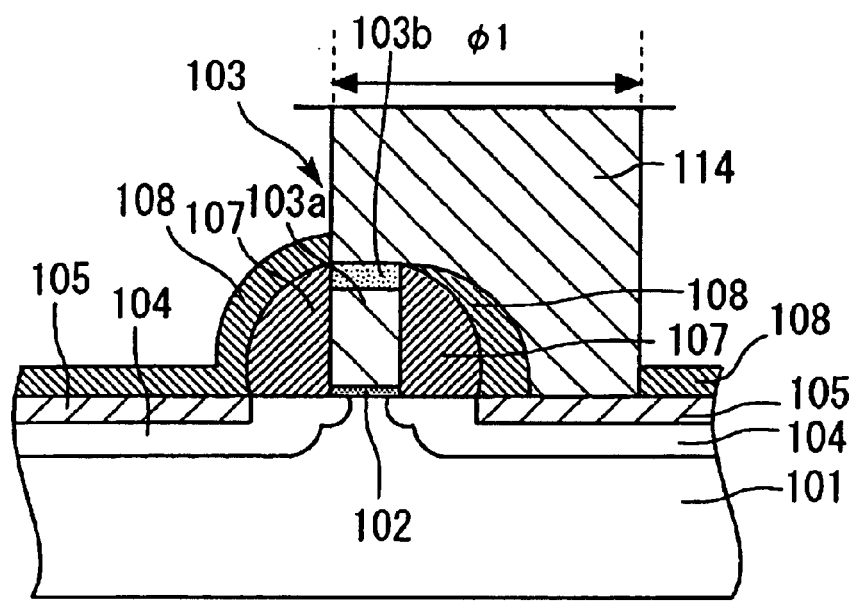
FIG. 19 is a schematic sectional view showing the configuration of another conventional MOS transistor of an SAC structure.

In Third Embodiment, since the dimensions of silicon nitride films 7 and 8 are optimized, and a uniform thickness of silicon nitride films 7 are formed along the sidewall of the gate electrode 3, $\phi$2 (see FIG. 9) can be made smaller than $\phi$1 (see FIG. 19) in comparison with the shared contact electrode 114 in FIG. 19, thereby reducing the size of a memory cell by this difference. Therefore, according to this configuration, the size of memory cells can be reduced, enabling high integration.

As FIG. 9 shows, the sum of the thickness of the silicon nitride film 7 and the silicon nitride film 8 on the side of the gate electrode 3 where the shared contact electrode 14 is formed (Tb+Td) is the same or larger than the length of the silicon nitride film 7 extending laterally from the side of the gate electrode 3 (Tsw). Thereby, the reach of the shared contact electrode 14 to the impurity diffusion layer 4 underlying the silicon nitride film 7 can be prevented.

When the structure shown in FIG. 9 is designed so as to be $\phi$2=$\phi$1, that is, when a shared contact electrode 14 of the same as the shared contact electrode shown in FIG. 19 is formed, the resistance to the gate electrode 3 and the resistance to the impurity diffusion layer 4 can further be reduced. Furthermore, electrical resistance can be reduced by the silicide film 3b and the silicide film 5 formed on to the gate electrode 3 and the impurity diffusion layer 4 as shown in FIG. 9.

Fourth Embodiment

Figure 10:
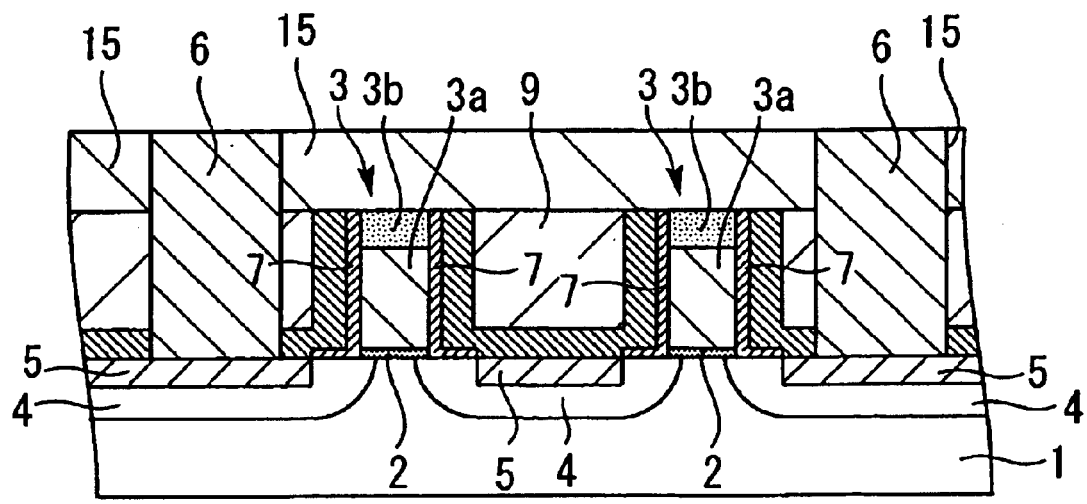
FIG. 10 is a schematic sectional view showing a semiconductor device according to Fourth Embodiment of the present invention.

FIG. 10 is a schematic sectional view showing a semiconductor device according to Fourth Embodiment of the present invention. Fourth Embodiment will be described below referring to the drawings. The semiconductor device of Fourth Embodiment has the configuration in which the silicon nitride films 7 and the silicon nitride films 8 on the upper surfaces of the gate electrodes 3 are removed, and a low-k film 15 is formed on the upper surfaces of the gate electrodes 3 as FIG. 10 shows.

By thus forming the low-k film 15 directly on the upper surfaces of the gate electrodes 3, the parasitic capacity between the upper layer wiring disposed on the upper surfaces of the gate electrodes 3 and the gate electrodes 3 can be reduced.

Figure 11A:
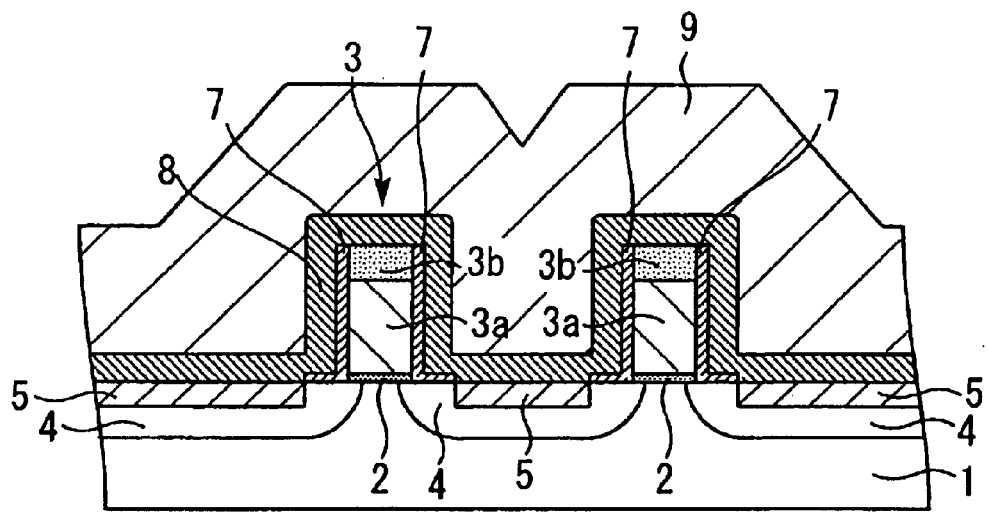
FIGS. 11A to 11C are schematic sectional views showing the sequence of steps for manufacturing the semiconductor device according to Fourth Embodiment.
Figure 11B:
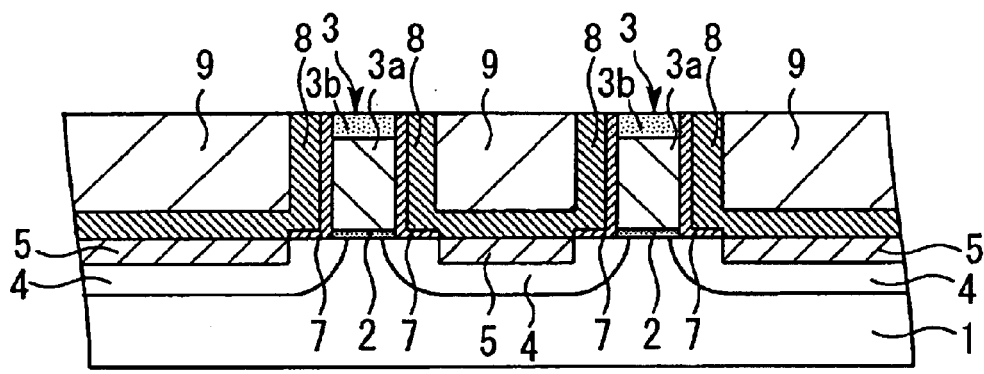
Figure 11C:
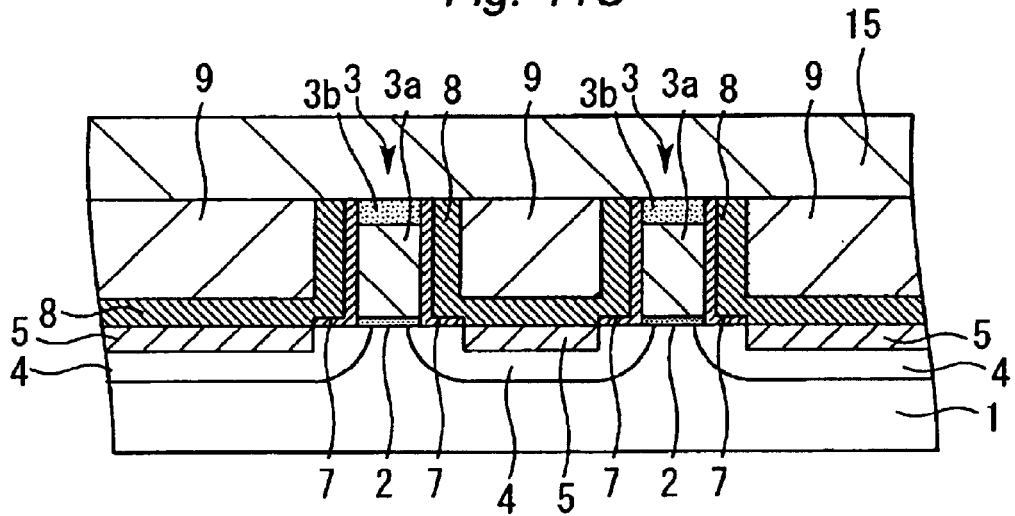

FIGS. 11a to 11C are schematic sectional views showing the method for manufacturing the semiconductor device shown in FIG. 10. The method for manufacturing the semiconductor device shown in FIG. 10 will be described below referring to FIGS. 11A to 11C.

First, as FIG. 11A shows, gate electrodes 3 are formed, and silicon nitride films 7 and silicon nitride films 8 are formed so as to cover the gate electrodes 3 in the same process as in FIG. 5, and then an interlayer insulating film 9 is formed so as to cover the silicon nitride films 8. Thereby, the upper surfaces of the gate electrodes 3 and the surface of the silicon semiconductor substrate 1 are covered with the interlayer insulating film 9.

Next, the surface of the interlayer insulating film 9 is polished and planarized by the CMP method. In this time, the silicon nitride films 7 and silicon nitride films 8 that cover the upper surfaces of the gate electrodes 3 are also polished and removed. Thereby, the silicide electrodes 3b on the upper surfaces of the gate electrodes 3 are exposed.

The silicide electrodes 3b on the upper surfaces of the gate electrodes 3 may be formed after the silicon nitride films 7 and silicon nitride films 8 on the upper surfaces of the gate electrodes 3 have been removed. In this case, the hard mask (oxide film, nitride film, etc.) used in the lithography process of the gate electrodes 3 may remain on the upper surface of the polysilicon electrodes 3a up to this process. This is because the hard mask can be removed in the process for polishing the silicon nitride films 8 by the CMP method. Also, the silicide electrodes 3b on the upper surfaces of the gate electrodes 3 may be formed again.

After the interlayer insulating film 9 has been polished, a low-k film 15 that has at least a lower dielectric constant than the dielectric constant of silicon nitride film, preferably of silicon oxide is formed using a method such as spin coating. It is not necessary in this case, that the low-k film 15 is embedded between the gate electrodes 3, because the interlayer insulating film 9 has been planarized by the CMP method. As a result, no films having a high dielectric constant are present on the upper layers of the gate electrodes 3, and the parasitic capacities between the gate electrodes 3 and the upper-layer wiring disposed on the upper layers of gate electrodes 3 can be reduced.

Fifth Embodiment

Figure 12:
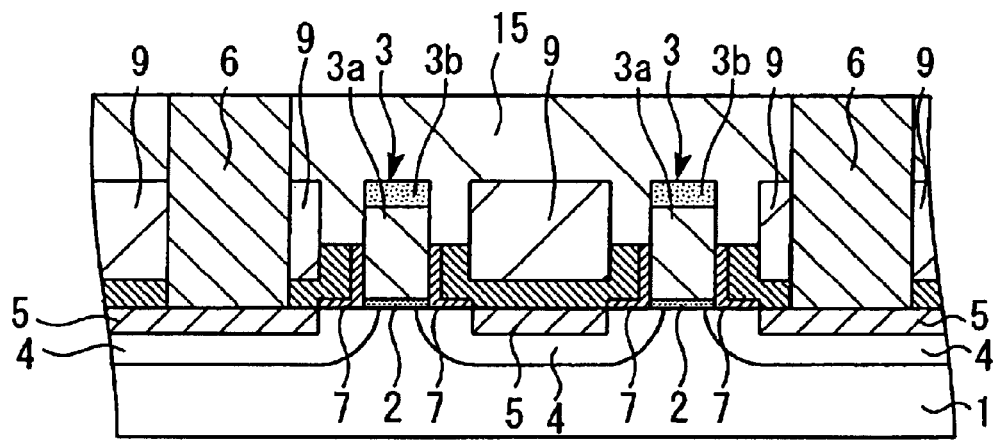
FIG. 12 is a schematic sectional view showing a semiconductor device according to Fifth Embodiment of the present invention.

FIG. 12 is a schematic sectional view showing a semiconductor device according to Fifth Embodiment of the present invention. Fifth Embodiment will be described below referring to the drawings. The semiconductor device of Fifth Embodiment has the configuration in which the silicon nitride films 8 on the upper surfaces of the gate electrodes 3 are removed as in Fourth Embodiment, and the silicon nitride films 7 and the silicon nitride films 8 on the upper portions of the sidewalls of the gate electrodes 3 are also removed, and a low-k film 15 is formed on the upper surfaces of the gate electrodes 3.

By thus removing the silicon nitride films 7 and the silicon nitride films 8 not only on the upper surfaces of the gate electrodes 3 but also on the upper portions of the sidewalls of the gate electrodes 3, the parasitic capacity between the wiring disposed on the upper surfaces of the gate electrodes 3 and the gate electrodes 3 can be reduced, and the generation of parasitic capacities between the gate electrodes 3, and the gate electrode 3 and the contact electrode 6 can be inhibited.

Figure 13A:
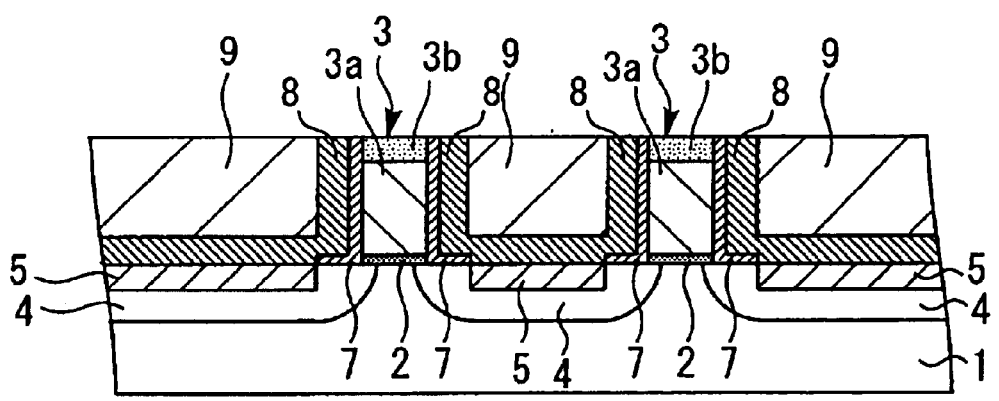
FIGS. 13A and 13B are schematic sectional views showing the sequence of steps for manufacturing the semiconductor device according to Fifth Embodiment.
Figure 13B:
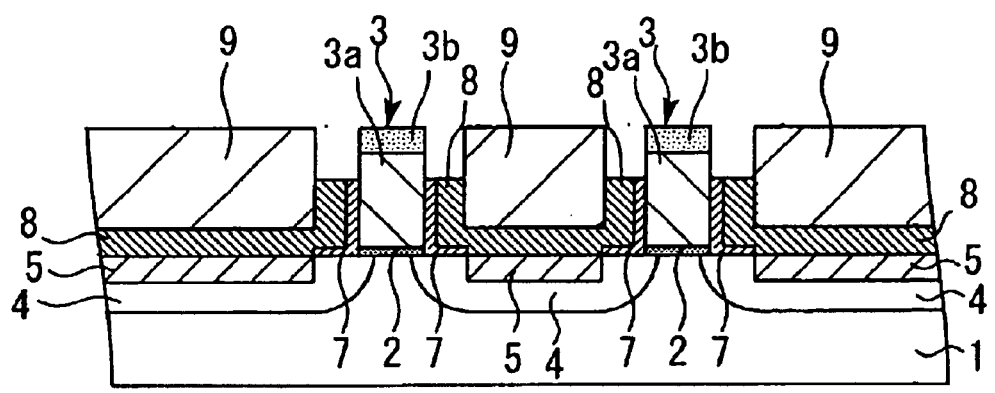

FIGS. 13A and 13b are schematic sectional views sequentially showing the method for manufacturing the semiconductor device shown in FIG. 12. Here, FIG. 13A shows the same process as in FIG. 11B, in which an interlayer insulating film 9 is formed on a silicon semiconductor substrate 1 so as to cover gate electrodes 3, and the interlayer insulating film 9 is planarized by the CMP method to expose the silicide films 3b of the gate electrodes 3.

Next, as FIG. 13B shows, the silicon nitride films 7 and the silicon nitride films 8 on the sidewalls of the gate electrodes 3 are removed from the above.

Thereafter, a low-k film 15 having a dielectric constant at least smaller than the dielectric constant of silicon nitride film is formed on the entire surface of the silicon semiconductor substrate 1. Thereby, the portions of the sidewalls of the gate electrodes 3 from which the silicon nitride films 7 and the silicon nitride films 8 have been removed can be filled with this insulating film, and the surface of the interlayer insulating film 9 can be covered with the insulating film. Thus, the semiconductor device of Fifth Embodiment shown in FIG. 12 can be formed.

According to the semiconductor device of Fifth Embodiment, the parasitic capacity between the upper layer wiring disposed on the upper surfaces of the gate electrodes 3 and the gate electrodes 3, as well as parasitic capacities between the gate electrodes 3, and the gate electrode 3 and the contact electrode 6 can be reduced.

Sixth Embodiment

Figure 14:
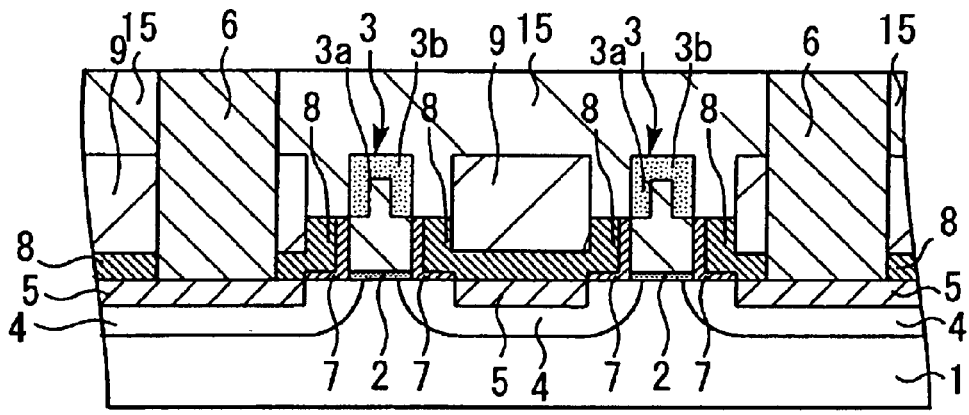
FIG. 14 is a schematic sectional view showing a semiconductor device according to Sixth Embodiment of the present invention.

FIG. 14 is a schematic sectional view showing a semiconductor device according to Sixth Embodiment of the present invention. Sixth Embodiment will be described below referring to the drawings. The semiconductor device of Sixth Embodiment is formed by extending the silicide film 3b constituting the upper portions of the gate electrodes 3 in the semiconductor device of Fifth Embodiment to the sidewalls from which the silicon nitride films 7 and the silicon nitride films 8 have been removed.

According to this configuration, the resistance of wiring can be improved by the silicidation of the gate electrodes 3, and since the upper surfaces and sidewalls of the gate electrodes 3 are not covered with the silicon nitride films 7 and the silicon nitride films 8, the inhibition of the silicide reaction due to stress can be prevented, and favorable and stable resistance properties can be obtained.

In particular, if the gate length is decreased due to factors such as downsizing, the silicide resistance becomes unstable. One of unstabilizing factors is that insulating films pushes the both sides of the polysilicon film 3a, and the silicide reaction is inhibited by stress.

In the configuration of the semiconductor device shown in FIG. 14, the insulating films (silicon nitride films 7 and silicon nitride films 8) on the both sides of the gate electrodes 3 are removed, and the upper surface and sidewalls of the gate electrode 3 are held open. When the silicide reaction is performed in this state, aggregation is difficult to occur, and the stabilization and the reduction of fine wire resistance can be realized.

In the process for forming silicide gate electrodes 3b, since all the polysilicon film 3a on the upper portions and sidewalls of the gate electrodes 3 can contribute to the silicide reaction, the resistance of wiring can be very low even in thin gate wiring.

According to the semiconductor device of Sixth Embodiment, the parasitic capacity between the upper layer wiring disposed on the upper surfaces of the gate electrodes 3 and the gate electrodes 3, as well as parasitic capacities between the gate electrodes 3, and the gate electrode 3 and the contact electrode 6 can be reduced, and since the gate electrodes 3 are not covered with silicon nitride films 7 and 8, the inhibition of the silicide reaction due to stress can be prevented, and favorable and stable resistance properties can be obtained.

The method for manufacturing the semiconductor device shown in FIG. 14 will be described below referring to FIGS. 15A and 15B. In this method, after silicon nitride films 7 and silicon nitride films 8 have been removed by wet etching in the process described referring to FIG. 13B, the silicidation of the gate electrodes 3 is performed. In Sixth Embodiment, therefore, the silicidation of the gate electrodes 3 is performed in the separate process from the silicidation of the impurity diffusion layer 4.

Figure 15A:
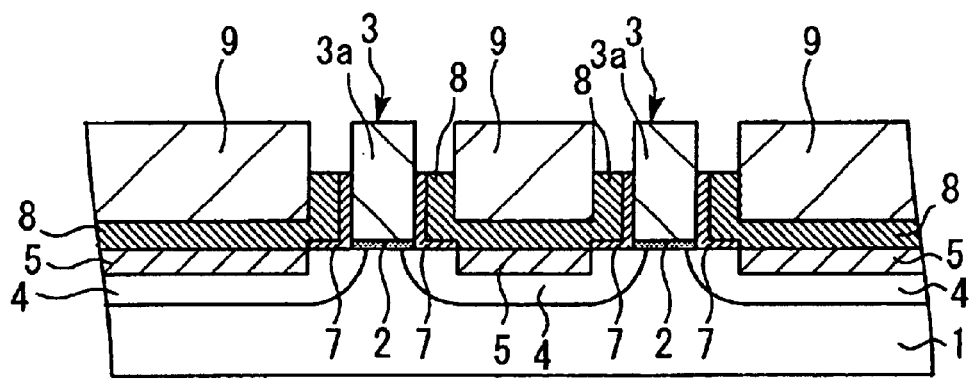
FIGS. 15A and 15B are schematic sectional views showing the sequence of steps for manufacturing the semiconductor device according to Sixth Embodiment.

Similar to the process up to FIG. 13B, FIG. 15A shows the state in which after the interlayer insulating film 9 has been polished by the CMP method, and the silicon nitride films 8 on the upper surface of the gate electrodes 3 have been removed, the silicon nitride films 7 and the silicon nitride films 8 on the sidewalls of the gate electrodes 3 have been removed by wet etching. In Sixth Embodiment, however, the silicidation of the gate electrodes 3 is not performed prior to this polishing process, and the gate electrodes 3 are composed of polysilicon electrodes 3*a* alone.

Figure 15B:
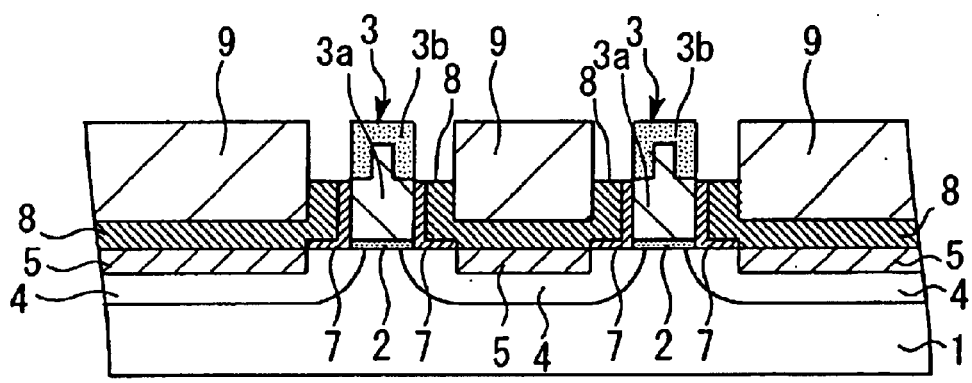
Figure 16:
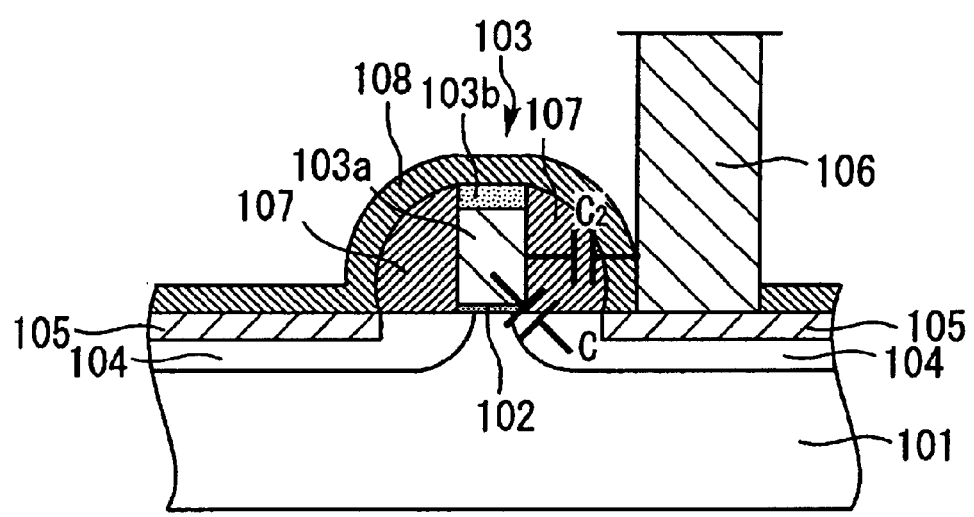
FIG. 16 is a schematic sectional view showing the configuration of a conventional MOS transistor of an SAC structure.
Figure 17:
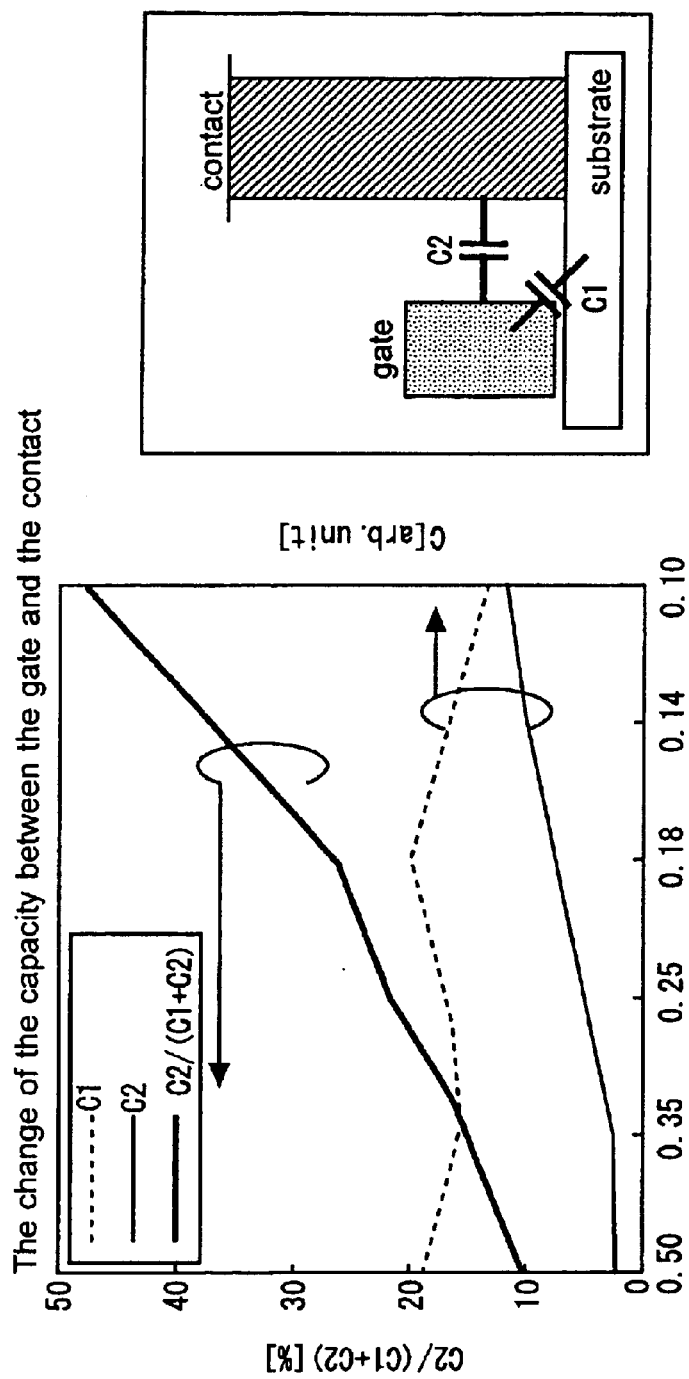
FIG. 17 is a schematic diagram showing the gate overlapping capacity in each generation.
Figure 18:
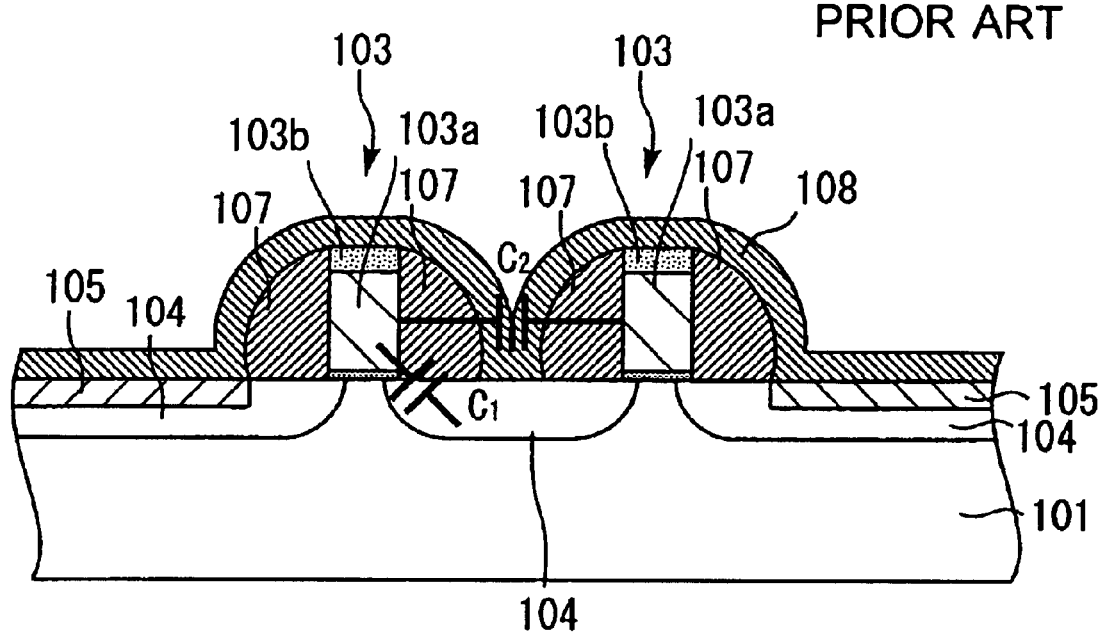
FIG. 18 is a schematic sectional view showing the configuration of another conventional MOS transistor of an SAC structure.

Next, as FIG. 15B shows, a refractory metal film, such as a titanium (Ti) film, is formed so as to cover the upper surface and sidewalls of the gate electrodes 3, and heat-treated to form silicide films 3*b* on the upper surface and sidewalls of the gate electrodes 3. Thereafter, the refractory metal film on the area other than the upper surface and sidewalls of the gate electrodes 3 is removed.

By thus removing the insulating films (silicon nitride films 7, silicon nitride films 8) from the sidewalls of gate electrodes 3, and performing the silicide reaction in the state of the upper surface and sidewalls of gate electrodes 3 held open, aggregation can be prevented, and the stabilization and reduction of the resistance of thin wire can be realized. Thereafter, a low-k film 15 is formed on the entire surface of the silicon semiconductor substrate 1 as in Fifth Embodiment to complete the semiconductor device shown in FIG. 14.

According to this manufacturing method, since the silicidation of the gate electrodes 3 can be performed in the separate process from the silicidation of the impurity diffusion layer 4, each process of silicidation can be optimized. Also, in the process for forming the sidewall spacer, since the sidewalls of the gate electrodes 3 is not exposed, and etching for exposing the sidewalls of the gate electrodes 3 is performed after the interlayer insulating film 9 has been polished, it is not required to perform forced etching for exposing the sidewalls when the sidewall spacers are formed. Therefore, compared with the method in which silicidation is performed after the sidewalls of the gate electrodes have been exposed by increasing the etching quantity in forming the sidewall spacers, over etching can be reduced significantly, and the damage of the gate insulating film, or the shaving of the silicon substrate or the element isolating film can be prevented.

According to the semiconductor device of Sixth Embodiment, since all the polysilicon film 3*a* on the upper portions of the gate electrodes 3 can contribute to the silicide reaction, the resistance of wiring can be very low even in thin gate wiring, and the semiconductor device that enables high-speed operation can be provided.

The features and the advantages of the present invention as described above may be summarizes as follows.

Since the sidewall spacer is produced by forming a first insulating film having an L-shaped cross section so as to extend from the sidewalls of gate electrodes to the surface of the semiconductor substrate, the thickness and volume of the sidewall spacer in the lateral direction of the gate electrodes can be minimized, and parasitic capacities between gate electrodes and between the gate electrode and the contact electrode can be reduced.

Since the thickness of the first insulating film is made substantially uniform, the thickness and volume of the sidewall spacer in the lateral direction of the gate electrodes can be reduced.

Since a second insulating film that covers the upper surfaces of gate electrodes and the semiconductor substrate, the contact hole to the impurity diffusion layer can be formed so as to self-align without reaching the gate electrodes and element isolating ends by using this second insulating film as an etching stopper film.

Since the length of the first insulating film in the lateral direction of the gate electrodes is specified to be at least twice the thickness of the first insulating film, the thickness of the first insulating film can be small enough in comparison with the length of the first insulating film on the semiconductor substrate, and the thickness and volume of the sidewall spacer in the lateral direction of the gate electrodes can be minimized, and parasitic capacities between gate electrodes and between the gate electrode and the contact electrode can be reduced.

Since the thickness of the second insulating film on the sidewalls of gate electrodes is made smaller than the thickness of the second insulating film on the upper surface of the gate electrodes, and the thickness of the second insulating film on the sidewalls of gate electrodes is made smaller than the thickness of the second insulating film on the surface of the semiconductor substrate, parasitic capacities between gate electrodes and between the gate electrode and the contact electrode can be reduced. Also, even if the contact hole or LIC wiring is misaligned from the gate electrodes, the contact hole or LIC wiring is difficult to contact the second insulating film on the sidewalls of the gate electrodes.

Since the thickness of the second insulating film on the upper surface of gate electrodes is made smaller than the thickness of the second insulating film on the surface of the semiconductor substrate, the quantity of over-etching during contact etching can be decreased, and the occurrence of junction leakage mainly caused by over-etching can be prevented.

Since the sum of the thickness of the first insulation film and the thickness of the second insulating film on the sidewalls of the gate electrodes is made substantially equal to the length of the first insulating film in the lateral direction of the gate electrodes, the occurrence of junction leakage or the elevation of contact resistance can be prevented even if the contact hole connected to the impurity diffusion layer is misaligned.

Since a hollow region is formed in the interlayer insulating film between gate electrodes adjacent to each other, the parasitic capacity between gate electrodes can be reduced.

Since the sidewall spacer consisting of a first insulating film having an L-shaped cross-section is formed, an LDD structure in which the impurity concentration in the bottom layer of the first insulating film is lowered can be formed.

Since a low-resistance film is formed on the surface of the impurity diffusion layer between gate electrodes adjacent to each other, the electrical resistance between the impurity diffusion layer and the contact electrode can be reduced.

Since a low-resistance film is formed on the upper surfaces or the sidewalls of the gate electrodes, the resistance of the gate electrodes can be lowered even if the gate length is narrowed, and the high-speed operation of the device can be realized.

Since an interlayer insulating film is formed between gate electrodes adjacent to each other, and a low-k film having a dielectric constant at least lower than the dielectric constant of silicon oxide film is formed on the interlayer insulating film and gate electrodes, parasitic capacity on the upper layers of gate electrodes can be reduced.

Since the second insulating film is removed from the upper surfaces of gate electrodes, and the upper surfaces of gate electrodes are allowed to contact the overlying low-k film, parasitic capacities on the upper layers of gate electrodes and overlying wirings can be reduced.

Since a specified quantity of the first and second insulation films on the sidewalls of gate electrodes is removed from the above, and these spaces are filled with overlying low-k film, parasitic capacities between gate electrodes and between the gate electrode and the contact electrode can be minimized.

Since a contact electrode connected to both the gate electrode and the impurity diffusion layer is formed in the structure in which a sidewall spacer having an L-shaped cross-section is formed so as to extend from the sidewall of the gate electrode to the surface of the semiconductor substrate, a shared contact electrode of a minimum occupying region can be formed, achieving downsizing.

Since a low-k film is formed between gate electrode adjacent to each other after once removing the first and second insulation films around gate electrodes, the further reduction of parasitic capacity between gate electrodes can be achieved.

What is claimed is:

1. A semiconductor device, comprising:
   a gate electrode formed on a semiconductor substrate through a gate insulating film;
   a pair of impurity diffusion layers formed on the surface region of said semiconductor substrate at both sides of said gate electrode;
   a first insulating film formed so as to cover the sidewalls of said gate electrode, and to extend to the surface area of a specific range of said semiconductor substrate only in the vicinity of said gate electrode;
   a second insulating film that covers said first insulating film and said semiconductor substrate including said gate electrode, and functions as an etch-stopper film, wherein said first insulating film is formed with a substantially uniform thickness, and
   the thickness of said second insulating film on the sidewall of said gate electrode is smaller than the thickness of said second insulating film on the top surface of said gate electrode, and the thickness of said second insulating film on the sidewall of said gate electrode is smaller than the thickness of said second insulating film on the surface of said semiconductor substrate.

2. The semiconductor device according to claim 1, wherein the lateral length of said first insulating film is twice the thickness of said first insulating film or more at the side of said gate electrode.

3. The semiconductor device according to claim 1, further comprising an interlayer insulating film formed between gate electrodes adjacent to each other, and a hollow region is formed in said interlayer insulating film between said gate electrodes.

4. The semiconductor device according to claim 1, further comprising a low-resistance film on the side of said gate electrode.

5. The semiconductor device according to claim 1 further comprising an interlayer insulating film formed between said gate electrodes adjacent to each other, and a film that has a low specific inductive capacity at least lower than the specific inductive capacity of a silicon oxide film, said film being formed on said interlayer insulating film and said gate electrode.

6. The semiconductor device according to claim 1 further comprising a contact electrode connected to said gate electrode on said gate electrode, and connected to one of said impurity diffusion layers.

7. The semiconductor device according to claim 1, wherein said first insulating film is formed with a dual-layer film or a multi-layer film.

8. A semiconductor device, comprising:
   a gate electrode formed on a semiconductor substrate through a gate insulating film;
   a pair of impurity diffusion layers formed on the surface region of said semiconductor substrate at both sides of said gate electrode; and
   a first insulating film formed so as to cover the sidewalls of said gate electrode, and to extend to the surface area of a specific range of said semiconductor substrate only in the vicinity of said gate electrode;
   a second insulating film that covers said first insulating film and said semiconductor substrate including said gate electrode, and functions as an etch-stopper film, wherein said first insulating film is formed with a substantially uniform thickness, and
   the thickness of said second insulating film on the top surface of said gate electrode is greater than the thickness of said second insulating film on the surface of said semiconductor substrate.

9. The semiconductor device according to claim 8, wherein said first insulating film is formed with a dual-layer film or a multi-layer film.

10. A semiconductor device, comprising:
    a gate electrode formed on a semiconductor substrate through a gate insulating film;
    a pair of impurity diffusion layers formed on the surface region of said semiconductor substrate at both sides of said gate electrode; and
    a first insulating film formed so as to cover the sidewalls of said gate electrode, and to extend to the surface area of a specific range of said semiconductor substrate only in the vicinity of said gate electrode, wherein said first insulating film is formed with a substantially uniform thickness, and
    the sum of the thickness of said first insulating film and the thickness of a second insulating film on the sidewall of said gate electrode is substantially equal to the lateral length of said first insulating film at the side of said gate electrode.

11. The semiconductor device according to claim 10, wherein said first insulating film is formed with a dual-layer film or a multi-layer film.

* * * * *